(12) United States Patent
Tanase et al.

(10) Patent No.: US 12,160,212 B2
(45) Date of Patent: Dec. 3, 2024

(54) OFFSET VOLTAGE COMPENSATION

(71) Applicant: Maxim Integrated Products, Inc., San Jose, CA (US)

(72) Inventors: Gabriel E. Tanase, Cupertino, CA (US); Walter Chi, Santa Clara, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 413 days.

(21) Appl. No.: 17/560,517

(22) Filed: Dec. 23, 2021

(65) Prior Publication Data

US 2022/0231647 A1    Jul. 21, 2022

Related U.S. Application Data

(60) Provisional application No. 63/139,869, filed on Jan. 21, 2021.

(51) Int. Cl.
*H03G 3/30* (2006.01)
*G01L 9/06* (2006.01)
*H03F 3/04* (2006.01)

(52) U.S. Cl.
CPC .................. *H03G 3/30* (2013.01); *G01L 9/06* (2013.01); *H03F 3/04* (2013.01); *H03F 2200/375* (2013.01); *H03G 2201/103* (2013.01)

(58) Field of Classification Search
None
See application file for complete search history.

(56) References Cited

U.S. PATENT DOCUMENTS

| | | |
|---|---|---|
| 7,124,632 B2 | 10/2006 | Smith |
| 9,057,801 B2 | 6/2015 | Jiang et al. |
| 9,385,673 B2 | 7/2016 | Ahmad et al. |
| 2009/0167432 A1 | 7/2009 | Van Den Heuvel |

FOREIGN PATENT DOCUMENTS

| | | | | |
|---|---|---|---|---|
| CN | 100419397 C | * | 9/2008 | |
| ES | 2652265 T3 | * | 2/2018 | ............... G01L 1/18 |
| JP | S61218912 A | * | 9/1986 | |
| JP | 2000214029 A | * | 8/2000 | |
| JP | 3544102 B2 | * | 7/2004 | |
| JP | 2007208427 A | | 8/2007 | |

\* cited by examiner

*Primary Examiner* — Daniel S Larkin
(74) *Attorney, Agent, or Firm* — Kevin E. West; Advent, LLP

(57) ABSTRACT

A sensor offset voltage compensation circuit includes a programmable gain amplifier (PGA) having an input loop configured to receive the signal output by a sensor (e.g., a voltage generated a sensor resistive bridge of a pressure sensor) and an output loop configured to furnish an output signal having a voltage that is greater than the input voltage. An offset compensation voltage is applied to at least one of the input loop or the output loop of the PGA to at least substantially cancel the zero-quantity offset voltage of the sensor from the output voltage.

20 Claims, 8 Drawing Sheets

OFFSET VOLTAGE COMPENSATION

BACKGROUND

A common type of pressure sensor employs bonded or formed strain gauges formed in a substrate to detect strain in the material of the substrate due to applied pressure. In such sensors, the strain gauges utilize the piezoresistive effect such that the resistance of the strain gauges increases as pressure deforms the material of the strain gauges. Generally, the strain gauges of these pressure sensors are arranged in a bridge configuration (e.g., in a Wheatstone bridge configuration) to maximize the output of the sensor and to reduce sensor's sensitivity to errors.

DRAWINGS

The detailed description is described with reference to the accompanying figures.

The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims.

DETAILED DESCRIPTION

Overview

Figure 1:
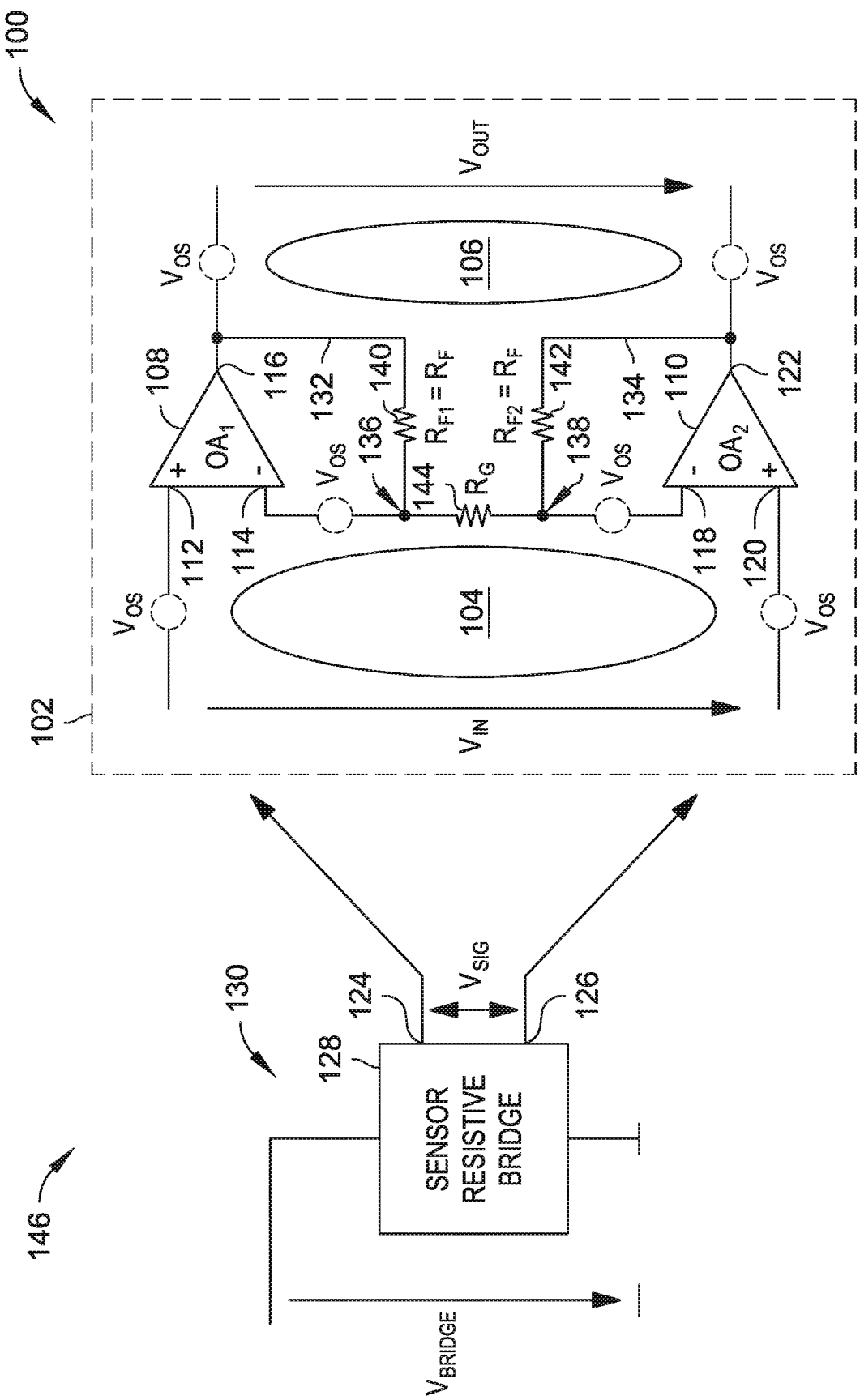
FIG. 1 is a circuit diagram illustrating a sensor offset voltage compensation circuit implemented using a programmable gain amplifier (PGA) in accordance with example embodiments of the present disclosure.

Sensors used to measure quantities such as pressure, strain, displacement, deformation, temperature, and the like often have zero-quantity (or zero-component) offsets in their output due to imperfections in their construction which cause the sensors to have an output when no quantity is sensed (e.g., the quantity sensed is equal to zero (0)). For example, pressure sensors that employ sensor resistive bridges to measure pressure may have a zero-pressure offset voltage in their output due to factors such as mismatch of the resistive elements (e.g., resistors, strain gauges, etc.) that make up the bridge. Such sensors, which may, for example, furnish full-scale output voltages in the range of 1 to 5 mV/V, have built-in zero-pressure offset voltages as high as 100 mV/V. Thus, the pressure signal cannot be accurately measured since the offset voltage dominates the output signal of the sensor. Consequently, some type of signal conditioning may be employed to compensate for this offset voltage. Prior sensor assemblies have addressed offset voltage compensation by inserting a voltage compensation in the analog front-end of the signal processor for the pressure sensor that requires a calculation based on bridge voltage and analog path gain. The compensation is then activated through selection of corresponding EEPROM bits loaded at power up of the device. The present disclosure provides for zero-pressure offset voltage compensation without requiring calculation.

Accordingly, an offset voltage compensation circuit is disclosed for cancelling the zero-offset voltage from a signal generated by a device such as a sensor, for example, a sensor resistive bridge of a pressure sensor. In accordance with the present disclosure, the signal generated by the sensor comprises a voltage (hereinafter the "input voltage") that includes a first component voltage that is proportional to the physical quantity (e.g., pressure) being sensed by the sensor and a second component voltage equal to the zero-quantity offset voltage, which corresponds to the voltage generated by the sensor when no physical quantity is sensed by the sensor, for example, when the pressure sensed by the pressure resistive bridge is zero (0).

The offset voltage compensation circuit comprises a programmable gain amplifier (PGA) having an input loop configured to receive the signal output by the sensor (e.g., a voltage generated a sensor resistive bridge of a pressure sensor) and an output loop configured to furnish an output signal having a voltage that is greater than the input voltage. An offset compensation voltage is applied to at least one of the input loop or the output loop of the PGA to at least substantially cancel the zero-quantity offset voltage from the output voltage supplied to the ADC. The offset compensation voltage is proportional to the bias voltage applied to the sensor to sense the physical quantity. For example, in embodiments wherein the sensor comprises a pressure resistive bridge, the offset compensation voltage is proportional to the bridge voltage applied to the sensor resistive bridge.

In embodiments, the PGA comprises a first amplifier having a first input, a first inverting input, and a first output and a second amplifier having a second input, a second inverting input, and a second output. The first input and the second input form the input loop and are configured to receive an input voltage from the sensor, wherein the input voltage comprises a sensor output voltage proportional to a physical quantity sensed by the sensor and a zero-quantity offset voltage corresponding to a voltage output by the sensor when no physical quantity is sensed by the sensor. The first output and the second output form the output loop and are configured to furnish an output voltage to an analog to digital converter (ADC), which converts the output voltage to a digital signal that is furnished to a digital signal processor, or the like, to be processed. An offset compensation voltage is applied to the first inverting input and the second inverting input with a resistor to at least substantially cancel the zero-quantity offset voltage from the output voltage. In embodiments, the offset compensation voltage is proportional to the bias voltage applied to the sensor to sense the physical quantity and comprises an offset current generated from the bias voltage applied across the resistor.

Example Implementations

Referring to FIG. 1, an offset voltage compensation circuit 100 in accordance with example embodiments of the present disclosure is described. As shown, the offset voltage compensation circuit 100 comprises a programmable gain amplifier (PGA) 102 that includes an input loop 104 and an output loop 106. As shown, the input loop 104 is configured to receive the signal output by a device such as the sensor resistive bridge 128 of a sensor 130, or the like.

In embodiments, the PGA 102 comprises one or more amplifiers. For example, as shown, the PGA 102 may comprise at least a first operational amplifier (OA1) 108 and a second operational amplifier (OA2) 110. The first operational amplifier 108 includes a first non-inverting input 112, a first inverting input 114, and a first output 116. Similarly, the second operational amplifier 110 includes a second non-inverting input 120, a second inverting input 118, and a second output 122. The first non-inverting input 112 and the second non-inverting input 120 are coupled to the outputs 124, 126, respectively, of the sensor resistive bridge 128 so that the input voltage $V_{IN}$ applied to the first non-inverting input 112 and the second non-inverting input 120 is equal to the output signal voltage $V_{SIG}$ generated by the sensor resistive bridge 128.

The output loop 106 is formed by the first output 116 and the second output 122 which have an output voltage $V_{OUT}$ which is greater than the input voltage $V_{IN}$ by a proportion equal to the gain G of the PGA. As shown, the operational amplifiers 108, 110 comprise non-inverting amplifiers having negative feedback loops 132, 134 via voltage dividers $R_{F1}/R_G$ 136 and $R_{F2}/R_G$ 138, respectively, formed by resistors 140, 142, 144 having resistances $R_{F1}$, $R_{F2}$, and $R_G$, respectively. Thus, the gain G of the PGA is $1+2R_F/R_G$, where $R_F=R_{F1}=R_{F2}$, so that $V_{OUT}=V_{IN}\cdot(1+2\cdot R_F/R_G)$. An ADC (e.g., ADC 274 of FIG. 2A) converts the output voltage $V_{OUT}$ to a digital signal that is furnished to a digital signal processor to be processed.

The input voltage $V_{IN}$ is equal to the signal voltage $V_{SIG}$ output by the sensor resistive bridge 128, which is comprised of a first component (output) voltage that is proportional to the physical quantity (e.g., pressure) being sensed by the sensor 130 and a second component voltage equal to the zero-quantity offset voltage $V_{SIG(0)}$. The zero-quantity offset voltage $V_{SIG(0)}$ corresponds to the voltage generated by the sensor when no physical quantity is sensed by the sensor 130 (e.g., when the quantity (e.g., pressure) sensed by the sensor resistive bridge 128 is zero (0)). For example, in a typical implementation, wherein the sensor 130 comprises a pressure sensor and the sensor resistive bridge 128 comprises a pressure sensor resistive bridge, the output voltage generated by the sensor resistive bridge may range from 1 mV/V to 5 mV/V, while the zero-pressure offset voltage $V_{SIG(0)}$ may be as high as 100 mV/V.

In accordance with the present disclosure, the offset voltage compensation circuit 100 applies a generated offset compensation voltage $V_{OS}$ to at least one of the input loop or the output loop of the PGA 102. For example, in various embodiments, as shown in FIG. 1, the offset voltage compensation circuit 100 may apply the offset compensation voltage $V_{OS}$ to the first inverting input 114 and/or the second inverting input 118, to the first non-inverting input 112 and/or the second non-inverting input 120, or the first output 116 and/or the second output 122. In this manner, the zero-quantity offset voltage $V_{SIG(0)}$ may be at least substantially canceled from the output voltage $V_{OUT}$ of the PGA 102.

In embodiments, the offset compensation voltage $V_{OS}$ is equal to, or substantially equal to, the zero-quantity offset voltage $V_{SIG(0)}$ and is proportional to the bias voltage applied to the sensor to sense the physical quantity. For example, in embodiments wherein the sensor 130 comprises a pressure sensor and the sensor resistive bridge comprises a pressure resistive bridge, the offset compensation voltage $V_{OS}$ is equal to, or substantially equal to, the zero-pressure offset voltage $V_{SIG(0)}$ and is proportional to the bridge voltage $V_{BRIDGE}$ applied to the pressure resistive bridge.

Figure 2A:
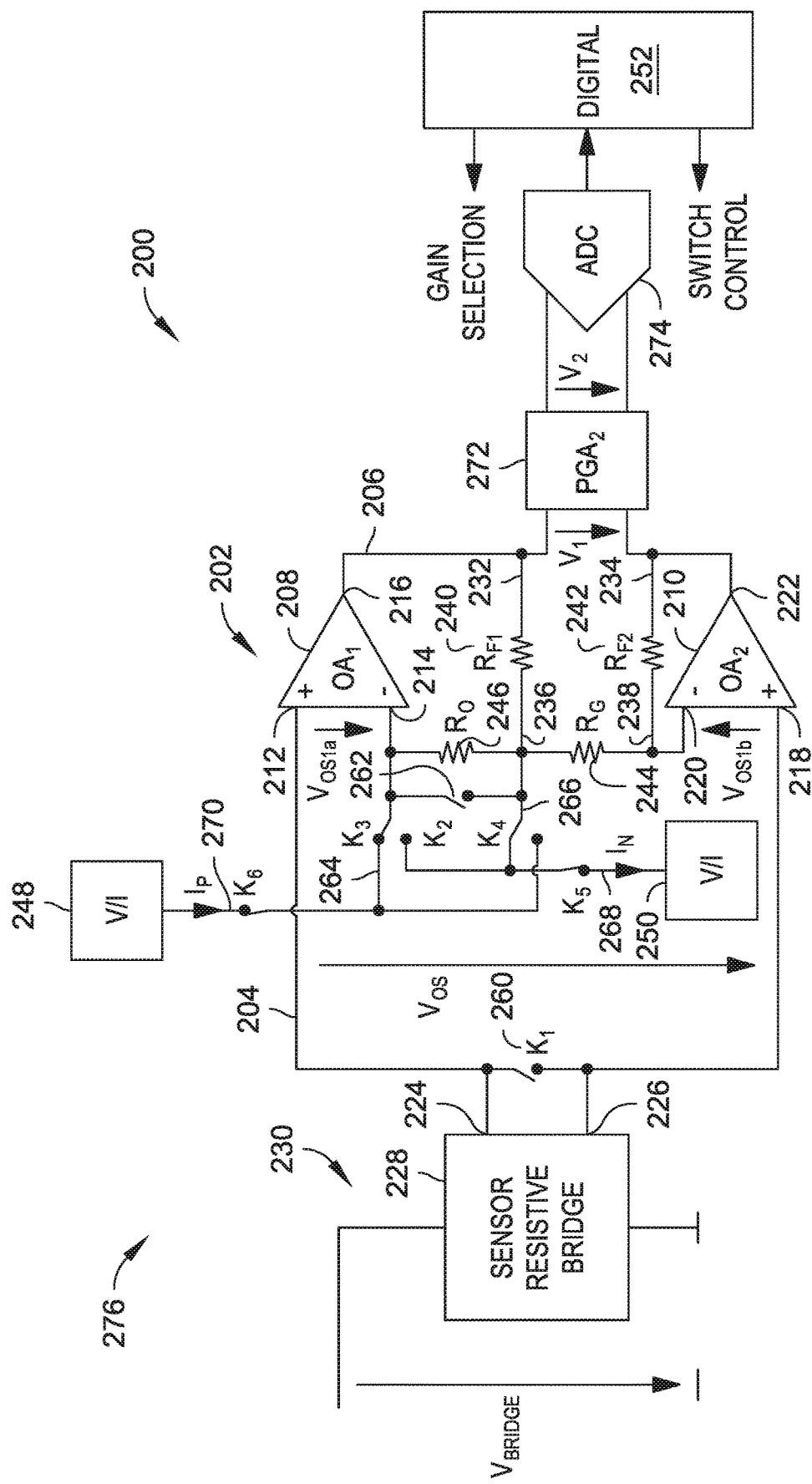
FIG. 2A is a circuit diagram illustrating a sensor offset voltage compensation circuit implemented using a PGA in accordance with the present disclosure, wherein an offset compensation voltage is applied to an input loop of the PGA.
Figure 2B:
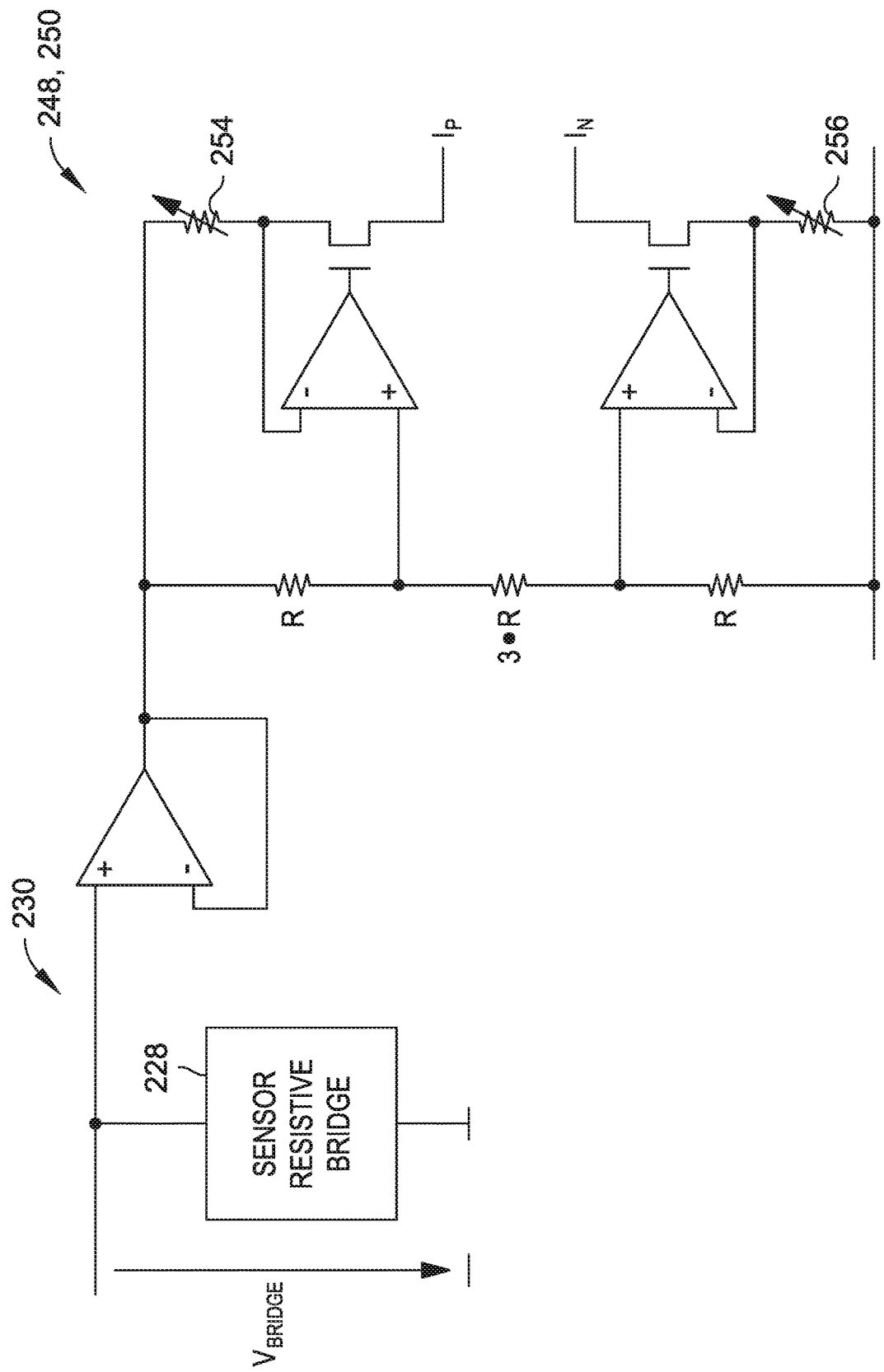
FIG. 2B is a circuit diagram illustrating a V/I circuit block of the PGA shown in FIG. 2A, in accordance with an example embodiment of the present disclosure.
Figure 2C:
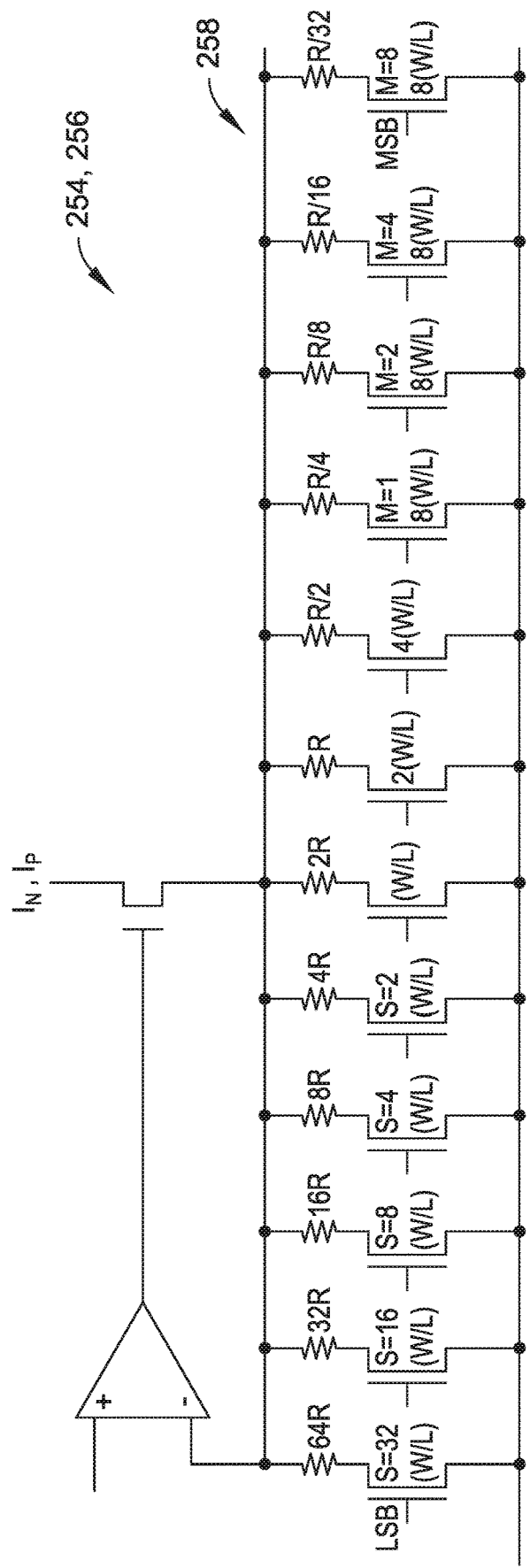
FIG. 2C is a circuit diagram illustrating a current trim circuit of the V/I block shown in FIG. 2B, in accordance with an example embodiment of the present disclosure.

FIGS. 2A, 2B, and 2C illustrate an implementation of the offset voltage compensation circuit 100 of FIG. 1 in accordance with an example embodiment of the present disclosure. As shown in FIG. 2A, the offset voltage compensation circuit 100 of FIG. 1 is configured as a sensor zero quantity-offset voltage compensation circuit 200 that comprises a first programmable gain amplifier (PGA) 202 having an input loop 204 and an output loop 206. The PGA 202 includes a first operational amplifier ($OA_1$) 208 and a second operational amplifier ($OA_2$) 210. The first operational amplifier 208 includes a first non-inverting input 212, a first inverting input 214, and a first output 216. Similarly, the second operational amplifier 210 includes a second non-inverting input 218, a second inverting input 220, and a second output 222.

The input loop 204 is configured to receive the signal output by the sensor resistive bridge 228 of the sensor 230. Specifically, as shown, the first non-inverting input 212 and the second non-inverting input 218 are coupled to the outputs 224, 226, respectively, of the sensor resistive bridge 228 so that the input voltage $V_{IN}$ applied to the first non-inverting input 212 and the second non-inverting input 218 is equal to the output signal voltage $V_{SIG}$ generated by the sensor resistive bridge 228.

The output loop 206 is formed by the first output 216 and the second output 222 which have an output voltage $V_1$ which is greater than the input voltage $V_{IN}$ by a proportion equal to the gain G of the PGA. As shown, the operational amplifiers 208, 210 comprise non-inverting amplifiers having negative feedback loops 232, 234 via voltage dividers $R_{F1}/R_G$ 236 and $R_{F2}/R_G$ 238, respectively, formed by resistors 240, 242, 244 having resistances $R_{F1}$, $R_{F2}$, and $R_G$, respectively. Thus, the voltage gain G1 of the first PGA 202 is $1+2R_F/R_G$, where $R_F=R_{F1}=R_{F2}$.

The input voltage $V_{IN}$ is equal to the signal voltage $V_{SIG}$ output by the sensor resistive bridge 228, which is comprised of a first component (output) voltage that is proportional to the physical quantity (e.g., pressure) being sensed by the sensor 230 and a second component voltage equal to the zero-quantity offset voltage $V_{SIG(0)}$. The zero-quantity offset voltage $V_{SIG(0)}$ corresponds to the voltage generated by the sensor when no physical quantity is sensed by the sensor 230 (e.g., when the quantity (e.g., pressure) sensed by the sensor resistive bridge 228 is zero (0)). For example, in an implementation wherein the sensor 230 comprises a pressure sensor and the sensor resistive bridge 228 comprises a pressure sensor resistive bridge, the output voltage generated by the sensor resistive bridge may range from 1 mV/V to 5 mV/V, while the zero-pressure offset voltage $V_{SIG(0)}$ may be as high as 100 mV/V.

In accordance with the present disclosure, the sensor offset voltage compensation circuit 200 applies a generated offset compensation voltage $V_{OS}$ to the input loop of the PGA 202. In embodiments, the offset compensation voltage $V_{OS}$ is equal to, or substantially equal to, the zero-quantity offset voltage $V_{SIG(0)}$ and is proportional to the bias voltage applied to the sensor 230 to sense the physical quantity. For example, in embodiments wherein the sensor 230 comprises a pressure sensor and the sensor resistive bridge comprises a pressure resistive bridge, the offset compensation voltage $V_{OS}$ is equal to, or substantially equal to, the zero-pressure offset voltage $V_{SIG(0)}$ and is proportional to the bridge voltage $V_{BRIDGE}$ applied to the pressure resistive bridge.

Specifically, as shown in FIG. 2A, the sensor offset voltage compensation circuit 200 may apply the offset compensation voltage $V_{OS}$ to the inverting inputs 214, 220 of the first and second operational amplifiers 208, 210 by generating a voltage equal to the zero-pressure offset voltage $V_{SIG(0)}$ across an offset resistor 246 having resistance $R_O$. In the embodiment shown, the bias voltage (e.g., the bridge voltage $V_{BRIDGE}$) applied to the sensor 230 is converted to current by voltage to current converters (V/I) 248, 250 to generate offset currents $I_P$ and $I_N$, which, in embodiments, are equal, or substantially equal, and adjusted so that the offset compensation voltage $V_{OS}$ is equal to the generated offset current $I_P$ and $I_N$ multiplied by the resistance $R_O$ of the offset resistor 246. Thus, Thus, $V_{OS}=I \cdot R_O$, where $I=I_P=I_N$.

FIGS. 2B and 2C illustrate an example voltage to current converters (V/I) 248, 250 that may be employed by the sensor offset voltage compensation circuit 200 to generate the offset currents $I_P$ and $I_N$. In embodiments, the offset compensation voltage $V_{OS}$ is generated to be equal, or at least substantially equal, to the zero-quantity offset voltage $V_{SIG(0)}$, which is proportional to the bias (bridge) voltage $V_{BRIDGE}$. Thus, $V_{OS}=V_{SIG(0)}=\varepsilon_{VOS} \cdot V_{BRIDGE}$. As shown in FIG. 2B, the voltage to current converters (V/I) 248, 250 generate offset currents $I_P$ and $I_N$ from the bias (bridge) voltage $V_{BRIDGE}$. These offset currents $I_P$ and $I_N$, which, in embodiments, are equal, can be expressed as $I=I_P=I_N=K_I \cdot V_{BRIDGE}/R_{TRIM}$, where $R_{TRIM}$ is a variable trim resistance and selected by the digital signal processor 252 and generated by trim circuits 254, 256 (FIG. 2C). Nevertheless, it is contemplated that, in many embodiments, mismatches will exist between the offset currents $I_P$ and $I_N$. Thus, the offset current $I_P$ can be determined by $I_P=I \cdot (1+\Delta I_P/I_P)$, while the offset current $I_N$ can be determined by $I_N=I \cdot (1+\Delta I_N/I_N)$, where $\Delta I_P$ and $\Delta I_N$ describe these mismatches.

FIG. 2C illustrates example trim circuits 254, 256 of the voltage to current converters (V/I) 248, 250. As shown, the trim circuits 254, 256 employ a digital to analog converter (DAC) 258 to select the trim resistance $R_{TRIM}$ in response to a digital signal from the digital signal processor 252. In embodiments, the number of trim bits employed by the DAC 258 to generate resistance $R_{TRIM}$ are determined from the lowest span of the first component (output) voltage and the largest zero-quantity offset voltage $V_{SIG(0)}$ of the signal output by the sensor 230. For example, for a sensor 230 having a lowest span of 1 mV/V and largest zero-quantity offset voltage $V_{SIG(0)}$ of 50 mV/V, the DAC 258 would require at least nine (9) bits to expand the pressure range 20 dB below the lowest span, and thus would use a twelve (12) bit DAC 258.

In the embodiment illustrated, a digital signal processor 252 selects the gain G of the PGA 202 and controls the generation and application of an offset compensation voltage $V_{OS}$ to the PGA 202 so that the magnitude and polarity of the offset compensation voltage $V_{OS}$ cancels the zero-quantity offset voltage $V_{SIG(0)}$. As shown in FIG. 2A, the digital signal processor 252 controls the switches $K_1$ 260, $K_2$ 262, $K_3$ 264, $K_4$ 266, $K_5$ 268, and $K_6$ 270. The switch $K_1$ 260 connects the outputs 224, 226 of the sensor 230 to the input loop 204 of the first PGA 202. The switch $K_2$ 262 is used for calibration of the sensor offset voltage compensation circuit 200. The switches $K_3$ and $K_4$ are used to select the polarity of the offset compensation voltage $V_{OS}$. The positions of switches $K_3$ and $K_4$ 264, 266 are determined by the polarity of the zero-quantity offset voltage $V_{SIG(0)}$ and are closed/opened (flipped) by the digital signal processor 252, accordingly. The switches $K_5$ and $K_6$ 268, 270 connect/disconnect their respective voltage to current converters (V/I) 248, 250.

When the input voltage is equal to the offset compensation voltage ($V_{IN}=V_{OS}$), the output voltage ($V_1$) of the first PGA 202 is $V_1=(V_{OS}+V_{OS1}-I_P \cdot R_O) \cdot (1+2 \cdot R_F/R_G)+R_F \cdot (I_N-I_P)$ where $V_{OS1}=V_{OS1b}-V_{OS1a}$. Since the gain ($G_1$) of the first PGA 202 is $G_1=1+2 \cdot R_F/R_G$, the output voltage $V_1$ of the first PGA 202 is determined from $V_1=[\varepsilon_{VOS}-K_I(R_O/R_{TRIM})] \cdot V_{BRIDGE} \cdot G_1 + V_{OS1} \cdot G_1 + K_I \cdot V_{BRIDGE} \cdot (R_F/R_{TRIM}) \cdot (\Delta I_N/I_N - \Delta I_P/I_P)$. Thus, zero-quantity offset voltage cancellation occurs when the trim resistance $R_{TRIM}=K_I \cdot R_O/\varepsilon_{VOS}$. Consequently, the sensor offset voltage compensation circuit 200 furnishes cancellation of the zero-quantity offset voltage $V_{SIG(0)}$ so that the voltage across the resistor $R_G$ is only, or at least primarily, the first component (output) voltage of the sensor 330 without no or at least almost no zero-quantity offset voltage $V_{SIG(0)}$. Thus, the zero-quantity offset compensation is independent of the bias (bridge) voltage ($V_{BRIDGE}$) of the sensor 230 and of the gain ($G_1$) of the PGA 202.

As shown in FIG. 2A, the sensor offset voltage compensation circuit 200 further comprises a second programmable gain amplifier ($PGA_2$). The second PGA 272 converts the output voltage $V_1$ of the first PGA 202 to a second output voltage $V_2$ having a lower impedance. An analog to digital converter (ADC) 274 converts the output voltage $V_2$ to a digital signal that is furnished to the digital signal processor 252 to be processed.

Figure 3A:
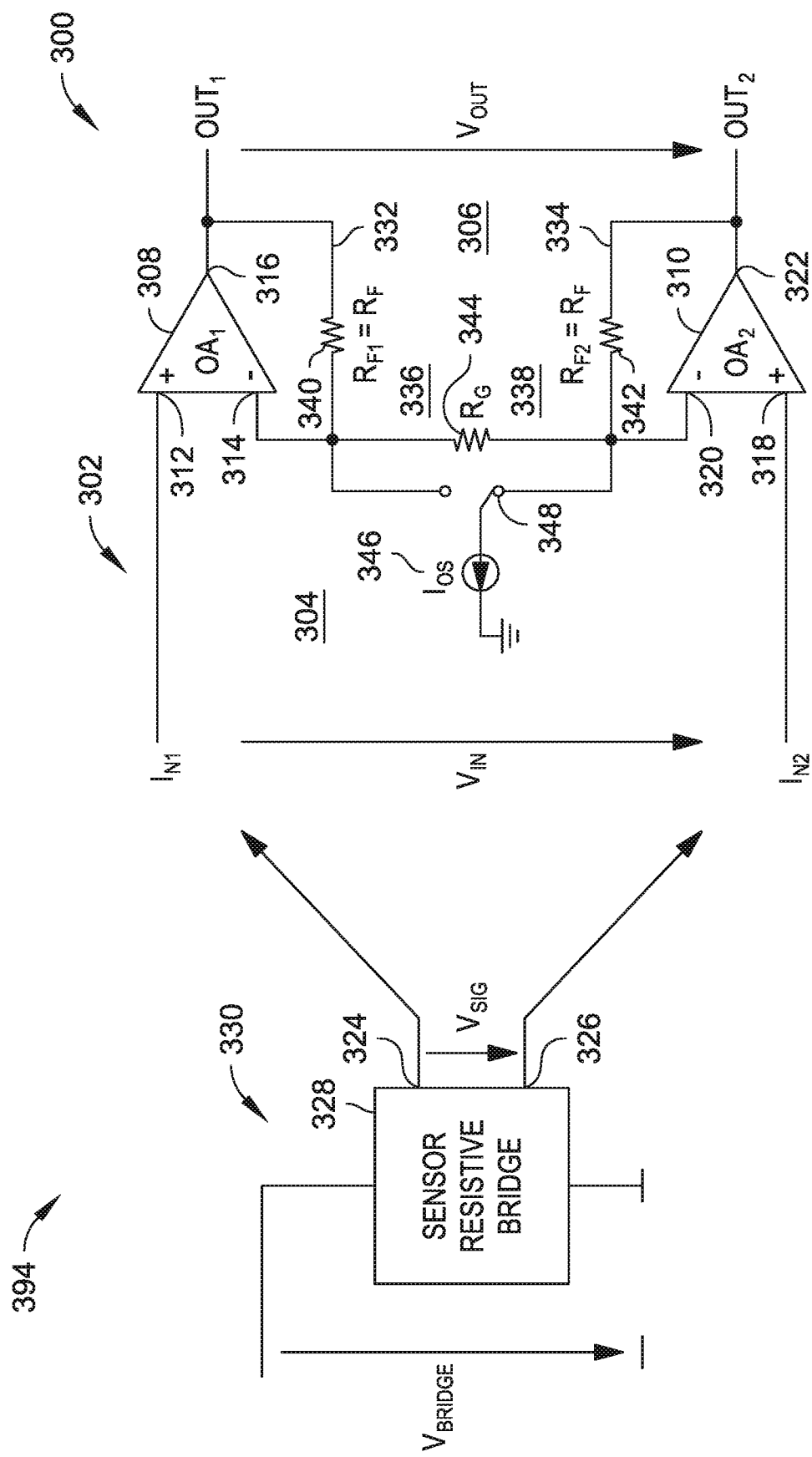
FIG. 3A is a circuit diagram illustrating a sensor offset voltage compensation circuit implemented using a PGA in accordance with the present disclosure, wherein an offset compensation voltage is applied to an output loop of the PGA.
Figure 3B:
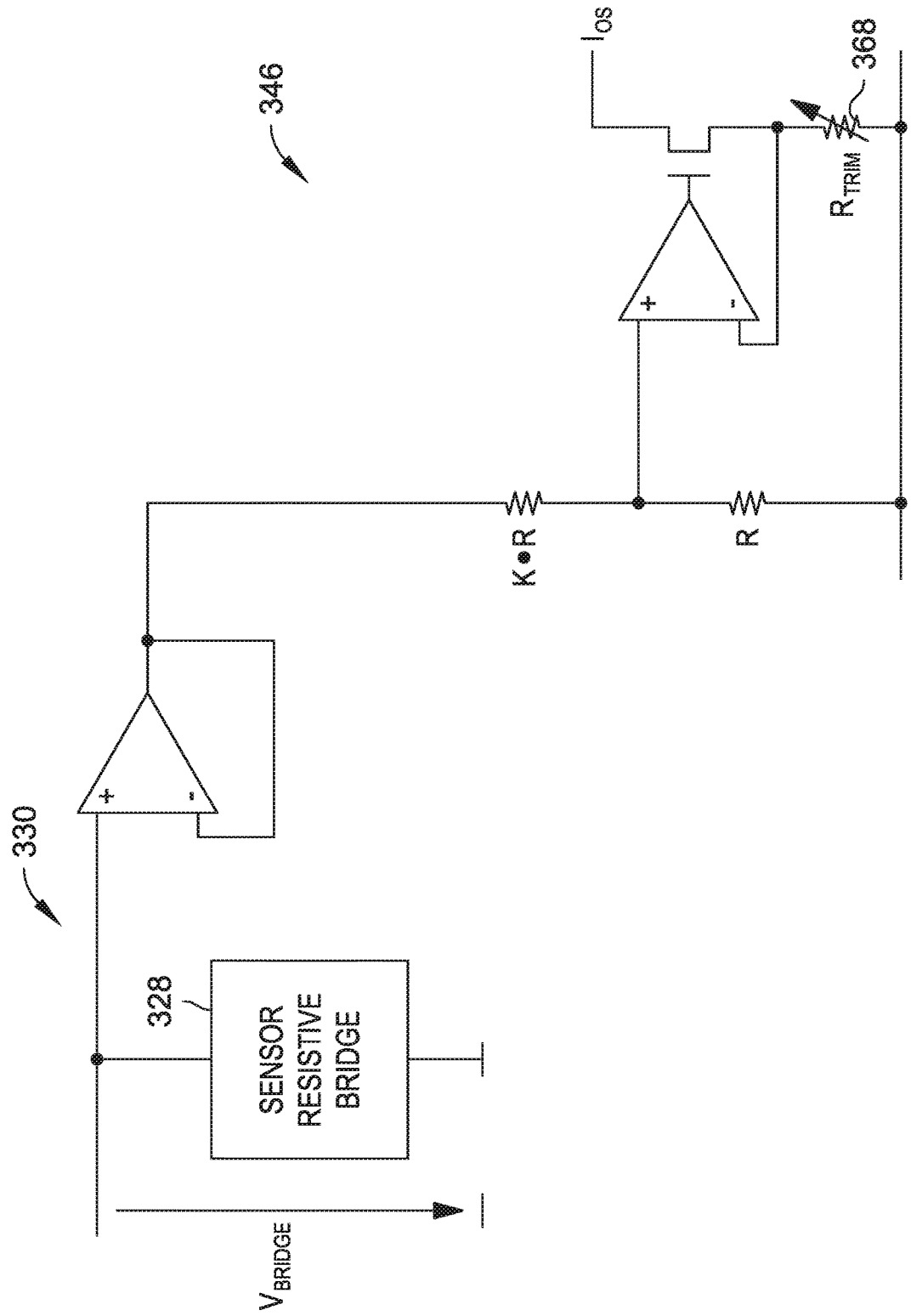
FIG. 3B is a circuit diagram illustrating a programmable current source for generating an offset current to furnish the offset compensation voltage of the PGA shown in FIG. 3A, in accordance with an example embodiment of the present disclosure.
Figure 3C:
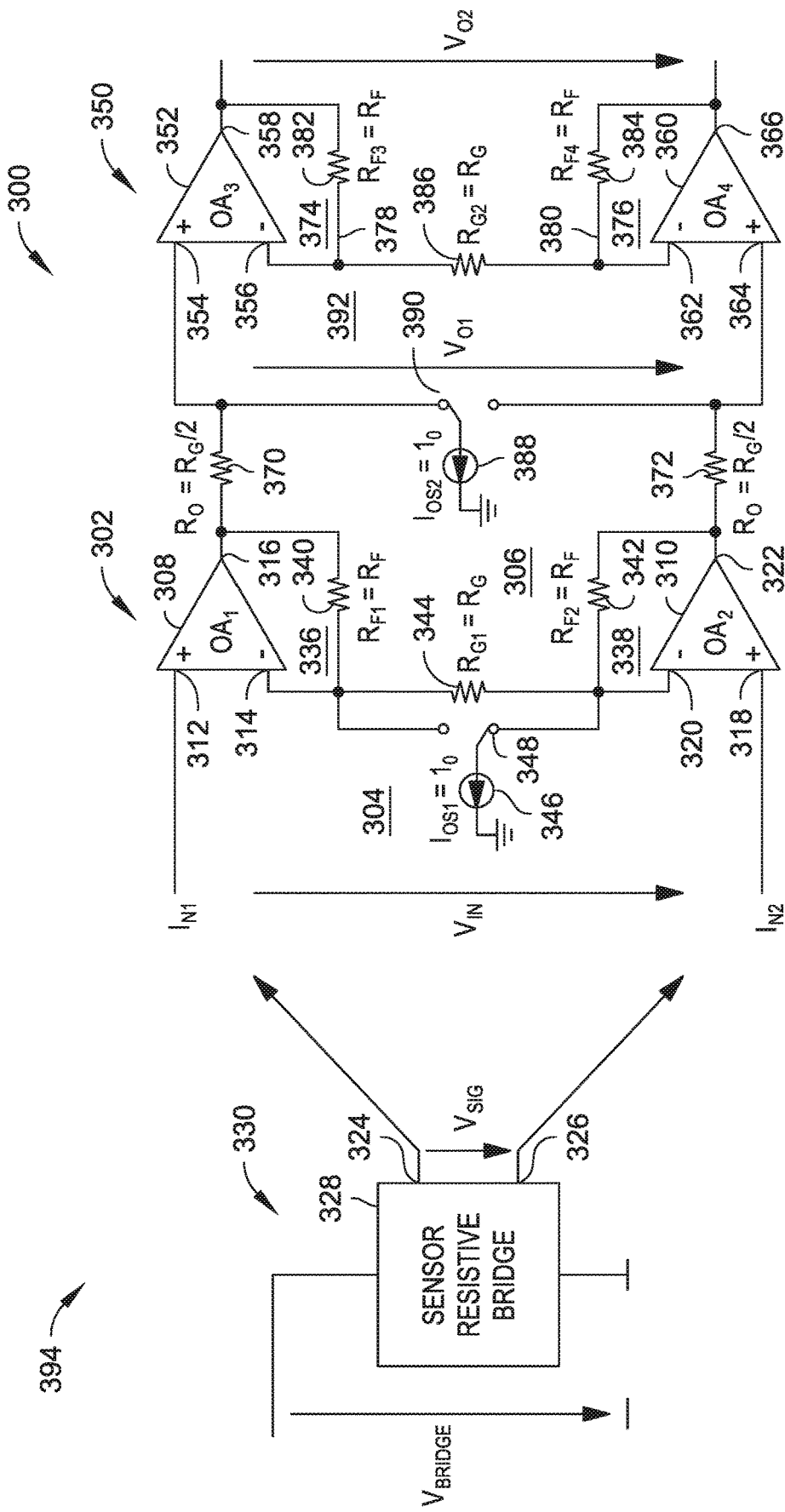
FIG. 3C is a circuit diagram illustrating a sensor offset voltage compensation circuit implemented using PGAs in accordance with the present disclosure, wherein an offset compensation voltage is applied to an output loop of the PGA, and where a second PGA is used to regulate the impedance of the circuit.

FIGS. 3A, 3B, and 3C illustrate additional implementations of the offset voltage compensation circuit 100 of FIG. 1 in accordance with example embodiments of the present disclosure. As shown in FIGS. 3A and 3C, the offset voltage compensation circuit of FIG. 1 is configured as a sensor zero-offset voltage compensation circuit 300 that comprises a programmable gain amplifier (PGA) 302 having an input loop 304 and an output loop 306. The PGA 302 includes a first operational amplifier ($OA_1$) 308 and a second operational amplifier ($OA_2$) 310. The first operational amplifier 308 includes a first non-inverting input 312, a first inverting input 314, and a first output 316. Similarly, the second operational amplifier 310 includes a second non-inverting input 318, a second inverting input 320, and a second output 322.

The input loop 304 is configured to receive the signal output by the sensor resistive bridge 328 of the sensor 330. Specifically, as shown, the first non-inverting input 312 and the second non-inverting input 318 are coupled to the outputs 324, 326, respectively, of the sensor resistive bridge 328 so that the input voltage $V_{IN}$ applied to the first non-inverting input 312 and the second non-inverting input 318 is equal to the output signal voltage $V_{SIG}$ generated by the sensor resistive bridge 328.

The output loop 306 is formed by the first output 316 and the second output 322 has an output voltage $V_{OUT}$ that is greater than the input voltage $V_{IN}$ by a proportion equal to the gain G of the PGA 302. As shown, the operational amplifiers 308, 310 comprise non-inverting amplifiers having negative feedback loops 332, 334 via voltage dividers $R_{F1}/R_G$ 336 and $R_{F2}/R_G$ 338, respectively, formed by resistors 340, 342, 344 having resistances $R_{F1}$, $R_{F2}$, and $R_G$, respectively. Thus, the gain G of the PGA 302 is $1+2 \cdot R_F/R_G$, where $R_F = R_{F1} = R_{F2}$.

The input voltage $V_{IN}$ is equal to the signal voltage $V_{SIG}$ output by the sensor resistive bridge 328, which is comprised of a first component (output) voltage that is proportional to the physical quantity (e.g., pressure) being sensed by the sensor 330 and a second component voltage equal to the zero-quantity offset voltage $V_{SIG(0)}$. The zero-quantity offset voltage $V_{SIG(0)}$ corresponds to the voltage generated by the sensor when no physical quantity is sensed by the sensor 330 (e.g., when the quantity (e.g., pressure) sensed by the sensor resistive bridge 328 is zero (0)). For example, in an implementation wherein the sensor 330 comprises a pressure sensor and the sensor resistive bridge 328 comprises a pressure sensor resistive bridge, the output voltage generated by the sensor resistive bridge may range from 1 mV/V to 5 mV/V, while the zero-pressure offset voltage $V_{SIG(0)}$ may be as high as 100 mV/V.

In the embodiment illustrated, the sensor offset voltage compensation circuit 300 applies a generated offset compensation voltage $V_{OS}$ to the output loop 306 of the PGA 302 that is equal to, or substantially equal to, the zero-quantity offset voltage $V_{SIG(0)}$ and is proportional to the bias voltage applied to the sensor 330 to sense the physical quantity. For example, in embodiments wherein the sensor 330 comprises a pressure sensor and the sensor resistive bridge comprises a pressure resistive bridge, the offset compensation voltage $V_{OS}$ is equal to, or substantially equal to, the zero-pressure offset voltage $V_{SIG(0)}$ and is proportional to the bridge voltage $V_{BRIDGE}$ applied to the pressure resistive bridge.

Specifically, the sensor offset voltage compensation circuit 300 includes a programmable current source 346 that generates an offset compensation current $I_{OS}$. The generated current $I_{CAL}$ is furnished to either the output $OUT_1$ 316 or the output $OUT_2$ 322 of the PGA 302 by a switch 348 depending on the polarity of the zero-quantity offset voltage $V_{SIG(0)}$. The offset compensation provided by the current $I_{OS}$ thus shows at the output loop 306 of the PGA 302 instead of the input loop 304.

FIG. 3B illustrates an example programmable current source 346 that may be employed by the offset voltage compensation circuit 300 of FIG. 3A to generate the offset current $I_{OS}$. In embodiments, the offset compensation voltage $V_{OS}$ is equal, or at least substantially equal, to the zero-quantity offset voltage $V_{SIG(0)}$, which is proportional to the bias (bridge) voltage $V_{BRIDGE}$. Thus, $V_{OS} = V_{SIG(0)} = \varepsilon \cdot V_{BRIDGE}$. As shown in FIG. 3B, the voltage programmable current source 346 generates the offset current $I_{OS}$ from the bias (bridge) voltage $V_{BRIDGE}$.

As noted, the gain G of the PGA 302 is equal to $1+2 \cdot (R_F/R_G)$. Thus, the output voltage $V_{OUT}$ is $-R_{F2} \cdot I_{OS} + V_{IN} \cdot [1+(R_{F1}+R_{F2})/R_G] = -R_{F2} \cdot I_{OS} + V_{IN} \cdot G$. Thus, when $V_{IN} = V_{OS}$, then $V_{OUT} = -R_F \cdot I_{OS} + V_{OS} \cdot [1+2 \cdot (R_F/R_G)] = -R_F \cdot I_{OS} + V_{OS} \cdot G$. Accordingly, to achieve input offset voltage calibration: $V_{OUT} = 0$, which gives $I_{OS} = G \cdot (V_{OS}/R_F)$. However, from FIG. 3B, $I_{OS} = V_{BRIDGE}/[(K+1) \cdot R_{TRIM}]$, where the offset compensation voltage is proportional to the bias (bridge) voltage $V_{OS} = \varepsilon \cdot V_{BRIDGE}$ and where $R_{TRIM}$ is a variable trim resistance and selected by a digital signal processor. Consequently, $1 = \varepsilon \cdot (K+1) \cdot G \cdot (R_{TRIM}/R_F)$. Thus, zero-quantity offset compensation is based on resistor ratio and occurs when the trim resistance $R_{TRIM} = R_F/[\varepsilon \cdot (K+1) \cdot G]$.

As shown in FIG. 3B, the programmable current source 346 includes a trim circuit 368 to select the trim resistance $R_{TRIM}$. In embodiments, the trim circuit 368 may employ a digital to analog converter (DAC) to select the trim resistance $R_{TRIM}$ in response to a digital signal from a digital signal processor (see FIG. 2C).

In FIG. 3C. the sensor offset voltage compensation circuit 300 further includes a second programmable gain amplifier (PGA) 350 that is used to regulate the impedance of the output voltage $V_{O1}$ of the first PGA 302. As shown, the second PGA 350 comprises a third operational amplifier ($OA_3$) 352 having a third non-inverting input 354, a third inverting input 356, and a third output 358, and a fourth operational amplifier ($OA_4$) 360 having a fourth non-inverting input 364, a fourth inverting input 362, and a fourth output 366. The third non-inverting input 354 and the fourth non-inverting input 364 are coupled to the first output 316 of the first operational amplifier 308 and the second output 322 of the second operational amplifier 310 across resisters 370, 372 (each having a resistance $R_O$), respectively and have a voltage $V_{O1}$.

The third output 358 and the fourth output 366 have an output voltage $V_{O2}$ that is greater than the output voltage of the first PGA 302 (designated $V_{O1}$ in FIG. 3C) by a proportion equal to the gain $G_2$ of the second PGA 350. As shown, the third and fourth operational amplifiers 352, 360 comprise non-inverting amplifiers having negative feedback loops 374, 376 via voltage dividers $R_{F3}/R_G$ 378 and $R_{F4}/R_G$ 380, respectively, formed by resistors 382, 384, 386 having resistances $R_{F3}$, $R_{F4}$, and $R_{G2}$, respectively, where $R_F = R_{F1} = R_{F2} = R_{F3} = R_{F4}$ and $R_G = R_{G1} = R_{G2}$. Thus, the gain G2 of the second PGA 350 is $1+2 \cdot R_F/R_G$.

In the embodiment illustrated, the sensor offset voltage compensation circuit 300 includes a second programmable current source 388 that generates a second offset compensation current $I_{OS2}$. (In FIG. 3C, the current generated by the first programmable current source 346 is designated $I_{OS1}$.) The generated current $I_{OS2}$ is furnished to either the non-inverting input 354 of the third operational amplifier 352 or the non-inverting input 364 of the fourth operational amplifier 360 of the second PGA 350 by a switch 390 depending on the polarity of the zero-quantity offset voltage $V_{SIG(0)}$. The offset compensation provided by the current $I_{OS2}$ thus shows at the input loop 392 of the second PGA 350.

For the offset compensation circuit shown in FIG. 3C, the addition of offset resistors 370, 372 having resistance $R_O$ allow the calibration of the offset compensation voltage $V_{OS}$ to be independent of the feedback resistance $R_F$ of the PGAs 302, 350. The output voltage $V_{O1}$ of the first PGA 302 is equal to $-R_O \cdot I_{OS2} - R_{F2} \cdot I_{OS1} + V_{IN} \cdot [1+(R_{F1}+R_{F2})/R_G]$. Assuming that the input voltage is equal to the offset compensation voltage ($V_{IN} = V_{OS}$), when no offset resistance is provided ($R_O = 0$), the output voltage $V_{O1}$ of the first PGA $302 - R_F \cdot I_O + V_{OS} \cdot [1+2 \cdot (R_F/R_G)]$. To calibrate the circuit for zero-quantity offset voltage $VV_{SIG(0)}$, the output voltage of the first PGA 302 is zero ($V_{O1} = 0$) when the offset current $I_O$ is equal to $(V_{OS/RF}) \cdot [1+2 \cdot (R_F/R_G)]$. Thus, when resistance $R_O$ is zero, calibration of the offset compensation voltage $V_{OS}$ based on offset current $I_O$ trim is a function of the feedback resistance $R_F$. However, with an offset resistance $R_O$ equal to half of the gain resistance $R_G$ is added ($R_O = R_G/2$), the output voltage $V_{O1}$ is equal to $(V_{OS} - R_O \cdot I_O) \cdot [1+2 \cdot (R_F/R_G)]$, assuming $V_{IN} = V_{OS}$. To calibrate the circuit for zero-quantity offset voltage $V_{SIG(0)}$, the output voltage of the first PGA 302 is zero ($V_{O1} = 0$) when the offset current $I_O$ is equal to $V_{OS}/R_O$. Thus, when a resistance $R_O$ that is equal to on half of the gain resistance is provided as shown in FIG.

3C, calibration of the offset compensation voltage $V_{OS}$ based on offset current $I_0$ trim is independent of the feedback resistance $R_F$.

As shown in FIGS. 1, 2A, 3A, and 3C, the sensor offset voltage compensation circuits 100, 200, 300 and respective sensors 130, 230, 330, together, each form a sensor system 146 (FIG. 1), 276 (FIG. 2A), 394 (FIGS. 3A and 3C), respectively, which may include other components. In embodiments, the sensor offset voltage compensation circuits 100, 200, 300, sensors 130, 230, 330, and/or sensor systems 146, 276, 394 may be fabricated as one or more integrated circuit chips, such as application specific integrated circuit (ASIC) chips, or the like.

The sensors 130, 230, 330 may comprise any type of sensor that may produce a zero-quantity offset voltage as described herein. For example, in embodiments, the sensors 130, 230, 330 may comprise a pressure bridge sensor. In such embodiments, the sensors 130, 230, 330 may employ any of a variety of fabrication technologies such as Silicon (Monocrystalline), Polysilicon Thin Film, Bonded Metal Foil, Thick Film, Silicon-on-Sapphire, Sputtered Thin Film, and so forth.

Figure 4:
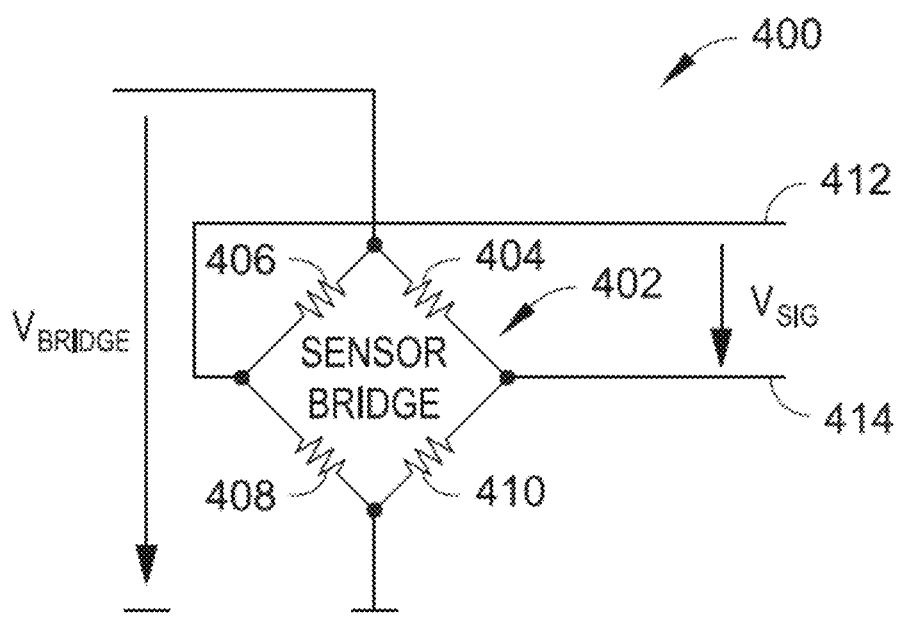
FIG. 4 is a circuit diagram illustrating a pressure sensor comprising a sensor resistive bridge in accordance with an example embodiment of the present disclosure.

FIG. 4 illustrates an example sensor 400 in accordance with an example embodiment of the present disclosure. The sensor 400, which in embodiments, may comprise a pressure sensor, includes sensor resistive bridge 402 that employs bonded or formed strain gauges (shown as resistors 404, 406, 408, 410), formed in a substrate to detect strain in a material due to applied pressure. The strain gauges 404, 406, 408, 410 utilize the piezoresistive effect such that the resistances of the strain gauges 404, 406, 408, 410 increase as pressure deforms the material of the substrate. As shown, the strain gauges 404, 406, 408, 410 are arranged in a bridge circuit configuration (e.g., in a Wheatstone bridge configuration). In the embodiment illustrated, the strain gauges 404, 406, 408, 410 of the sensor resistive bridge 402 are arranged in a closed bridge configuration. However, it is contemplated that the sensor resistive bridge 402 may employ a half open configuration, a full open configuration, or the like. The sensor 400 may utilize a variety of fabrication technologies, such as Silicon (Monocrystalline), Polysilicon Thin Film, Bonded Metal Foil, Thick Film, Silicon-on-Sapphire, Sputtered Thin Film, and so forth.

As shown, when a bias (bridge) voltage $V_{BRIDGE}$ is applied across the sensor resistive bridge 402, a voltage $V_{SIG}$ is produced across outputs 412, 414. As noted above, this voltage $V_{SIG}$ includes a first component equal to the output voltage $V_{SIG}$ that is proportional to the physical quantity (e.g., pressure) being sensed by the sensor 400 and a second component voltage equal to the zero-quantity offset voltage $V_{SIG(0)}$. The zero-quantity offset voltage $V_{SIG(0)}$ corresponds to the voltage generated by the sensor when no physical quantity is sensed by the sensor 400, for example, when the quantity (e.g., pressure) sensed by the sensor resistive bridge 402 is zero (0). This, zero-quantity offset voltage $V_{SIG(0)}$ is caused by imperfections in the construction of the sensor resistive bridge 402 such as mismatch of the resistance of the strain gauges 404, 406, 408, 410, or the like, which causes the sensor 400 to have an output voltage when no quantity (e.g., pressure) is sensed (e.g., the quantity sensed is equal to zero (0)). For example, in a typical implementation, wherein the sensor 130 comprises a pressure sensor and the sensor resistive bridge 128 comprises a pressure sensor resistive bridge, the output voltage generated by the sensor resistive bridge may range from 1 mV/V to 5 mV/V, while the zero-pressure offset voltage $V_{SIG(0)}$ may be as high as 100 mV/V.

When introducing elements of aspects of the disclosure or the examples thereof, the articles "a," "an," "the," and "said" are intended to mean that there are one or more of the elements. The terms "comprising," "including," and "having" are intended to be inclusive and mean that there may be additional elements other than the listed elements.

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. An offset voltage compensation circuit comprising:
a first amplifier having a first input, a first inverting input, and a first output; and
a second amplifier having a second input, a second inverting input, and a second output;
wherein the first input and the second input form an input loop configured to receive an input voltage from a sensor, the input voltage comprising a sensor output voltage proportional to a physical quantity sensed by the sensor and a zero-quantity offset voltage corresponding to a voltage output by the sensor when no physical quantity is sensed by the sensor,
wherein the first output and the second output form an output loop configured for furnishing an output voltage to an analog to digital converter, and
wherein an offset compensation voltage is applied to the first inverting input and the second inverting input with a resistor, the offset compensation voltage being applied to cancel the zero-quantity offset voltage from the output voltage, the offset compensation voltage being proportional to a bias voltage applied to the sensor to sense the physical quantity, and the output compensation voltage comprising an offset current generated from the bias voltage applied across the resistor.

2. The offset voltage compensation circuit as recited in claim 1, wherein the first and second amplifiers comprise operational amplifiers.

3. The offset voltage compensation circuit as recited in claim 1, wherein the output loop is configured to be coupled to an analog to digital converter configured for converting the output voltage to a digital signal, the digital signal furnished to a digital signal processor configured to cause the offset current to be generated in response thereto.

4. The offset voltage compensation circuit as recited in claim 3, further comprising a voltage to current converter configured to generate the offset current from the bias voltage using a variable trim resistance selected by the digital signal processor via a trim circuit.

5. The offset voltage compensation circuit as recited in claim 4, wherein the trim circuit comprises a digital to analog converter coupled with the digital signal processor, the digital to analog converter configured to select a trim resistance in response to a digital signal from the digital signal processor.

6. The offset voltage compensation circuit as recited in claim 5, wherein the digital signal processor controls the offset compensation voltage so that the magnitude and polarity of the offset compensation voltage cancels the zero-quantity offset voltage.

7. The offset voltage compensation circuit as recited in claim 1, wherein the sensor comprises a pressure sensor and the physical quantity comprises a pressure.

8. An offset compensation circuit comprising:
- a programmable gain amplifier configured to be coupled to a sensor operable for sensing a physical quantity, the programable gain amplifier comprising:
  - a first amplifier having a first input, a first inverting input, and a first output; and
  - a second amplifier having a second input, a second inverting input, and a second output;
  - wherein the first input and the second input form an input loop configured to receive an input voltage from a sensor, the input voltage comprising a sensor output voltage proportional to a physical quantity sensed by the sensor and a zero-quantity offset voltage corresponding to a voltage output by the sensor when no physical quantity is sensed by the sensor,
  - wherein the first output and the second output form an output loop configured for furnishing an output voltage, and
  - wherein an offset compensation voltage is applied to the first inverting input and the second inverting input with a resistor, the offset compensation voltage being applied to cancel the zero-quantity offset voltage from the output voltage, the offset compensation voltage being proportional to a bias voltage applied to the sensor to sense the physical quantity, and the output compensation voltage comprising an offset current generated from the bias voltage applied across the resistor; and
- an analog to digital converter configured for converting the output voltage to a digital signal for processing.

9. The offset voltage compensation circuit as recited in claim 8, further comprising a digital signal processor configured to receive the digital signal from the analog to digital converter and to cause the current to be generated in response thereto.

10. The offset voltage compensation circuit as recited in claim 9, further comprising a voltage to current converter configured to generate the offset current from the bias voltage using a variable trim resistance selected by the digital signal processor via a trim circuit.

11. The offset voltage compensation circuit as recited in claim 10, wherein the trim circuit comprises a digital to analog converter coupled with the digital signal processor, the digital to analog converter configured to select a trim resistance in response to a digital signal from the digital signal processor.

12. The offset voltage compensation circuit as recited in claim 11, wherein the digital signal processor controls the offset compensation voltage so that the magnitude and polarity of the offset compensation voltage cancels the zero-quantity offset voltage.

13. The offset voltage compensation circuit as recited in claim 8, wherein the sensor comprises a pressure sensor and the physical quantity comprises a pressure.

14. A sensor assembly comprising:
- a sensor operable for sensing a physical quantity, the sensor configured to generate a first voltage upon application of a bias voltage to the sensor, the first voltage comprising a sensor output voltage proportional to the physical quantity sensed by the sensor and a zero-quantity offset voltage corresponding to the sensor output voltage generated by the sensor when no physical quantity is sensed by the sensor; and
- a signal processing assembly, the signal processing assembly comprising:
  - a programmable gain amplifier interconnected with the sensor, the programable gain amplifier comprising a first amplifier having a first input, a first inverting input, and a first output; and a second amplifier having a second input, a second inverting input, and a second output;
  - wherein the first input and the second input form an input loop configured to receive an input voltage from the sensor, the input voltage comprising the sensor output voltage proportional to the physical quantity sensed by the sensor and the zero-quantity offset voltage corresponding to a voltage output by the sensor when no physical quantity is sensed by the sensor,
  - wherein the first output and the second output form an output loop configured for furnishing an output voltage, and
  - wherein an offset compensation voltage is applied to the first inverting input and the second inverting input with a resistor, the offset compensation voltage being applied to cancel the zero-quantity offset voltage from the output voltage, the offset compensation voltage being proportional to a bias voltage applied to the sensor to sense the physical quantity, and the output compensation voltage comprising an offset current generated from the bias voltage applied across the resistor;
  - an analog to digital converter configured for converting the output voltage to a digital signal; and
  - a digital signal processor configured to receive the digital signal from the analog to digital converter and to cause the offset compensation voltage to be provided to the programmable gain amplifier in response thereto.

15. The sensor assembly as recited in claim 14, wherein the first amplifier and the second amplifier comprise operational amplifiers.

16. The sensor assembly as recited in claim 14, further comprising a voltage to current converter configured to generate the offset current from the bias voltage using a variable trim resistance selected by the digital signal processor via a trim circuit.

17. The sensor assembly as recited in claim 16, wherein the trim circuit comprises a digital to analog converter coupled with the digital signal processor, the digital to analog converter configured to select a trim resistance in response to a digital signal from the digital signal processor.

18. The offset voltage compensation circuit as recited in claim 17, wherein the digital signal processor controls the offset compensation voltage so that the magnitude and polarity of the offset compensation voltage cancels the zero-quantity offset voltage.

19. The sensor assembly as recited in claim 14, wherein the sensor comprises a sensor resistive bridge employing a plurality of strain gauges.

20. The sensor assembly as recited in claim 14, wherein the sensor comprises a pressure sensor and the physical quantity comprises a pressure.

* * * * *